(12) United States Patent
Hayashi

(10) Patent No.: US 8,174,843 B2
(45) Date of Patent: May 8, 2012

(54) PRINTED CIRCUIT BOARD

(75) Inventor: Seiji Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 409 days.

(21) Appl. No.: 12/522,100

(22) PCT Filed: Jun. 4, 2008

(86) PCT No.: PCT/JP2008/060625
§ 371 (c)(1),
(2), (4) Date: Jul. 2, 2009

(87) PCT Pub. No.: WO2008/156014
PCT Pub. Date: Dec. 24, 2008

(65) Prior Publication Data
US 2010/0039784 A1      Feb. 18, 2010

(30) Foreign Application Priority Data

Jun. 19, 2007  (JP) .................. 2007-160907
Apr. 30, 2008  (JP) .................. 2008-118808

(51) Int. Cl.
*H05K 1/11*      (2006.01)
*H05K 1/14*      (2006.01)
(52) U.S. Cl. ......... 361/794; 361/792; 361/793; 361/795
(58) Field of Classification Search .......... 361/763–766, 361/782, 792–795
See application file for complete search history.

(56) References Cited

U.S. PATENT DOCUMENTS

| 6,995,629 | B2 | 2/2006 | Nishimura | 333/22 |
| 7,466,560 | B2 * | 12/2008 | Hayashi et al. | 361/784 |
| 2006/0050491 | A1 | 3/2006 | Hayashi et al. | 361/760 |
| 2006/0125570 | A1 | 6/2006 | Hamada et al. | 333/12 |
| 2007/0136618 | A1 | 6/2007 | Ohsaka | 713/323 |

FOREIGN PATENT DOCUMENTS

| DE | 102004014439 | 7/2005 |
| EP | 0472317 | 2/1992 |
| JP | 2006-261470 | 9/2006 |

OTHER PUBLICATIONS

International Search Report mailed Nov. 25, 2008 in corresponding International Application No. PCT/JP2008/060625.
Korean Office Action dated Mar. 21, 2011 in corresponding Korean Application No. 10-2009-7022886, and English-language translation thereof.
International Preliminary Report on Patentability dated Jan. 7, 2010 in corresponding International Application No. PCT/JP2008/060625.
U.S. Appl. No. 12/534,834, filed Aug. 3, 2009, Inventor: Seiji Hayashi.

* cited by examiner

*Primary Examiner* — Tuan T Dinh
(74) *Attorney, Agent, or Firm* — Fitzpatrick, Cella, Harper & Scinto

(57) ABSTRACT

A power source terminal and a ground terminal for a semiconductor integrated circuit are connected to a conductor pattern through a capacitor. The conductor pattern is connected, through a filter, to a plane conductor connected to neither a ground plane nor a power source plane. Thus, a common mode noise arising from between the power source and the ground is caused to flow into the plane conductor. This reduces the common mode noise flowing in the ground and the power source of the printed wiring board, which relatively act as antennas.

1 Claim, 12 Drawing Sheets

ZERO POTENTIAL

ZERO POTENTIAL

PRINTED CIRCUIT BOARD

TECHNICAL FIELD

The present invention relates to printed circuit boards in which a semiconductor element such as an LSI is mounted on a printed wiring board.

BACKGROUND ART

Due to recent further increases in integration and processing speed of LSI (Large-Scale Integration), problems caused by changes in LSI power sources or ground potential have been increasing. In order for an LSI circuit to be operated, a power source for applying a high potential and a ground for applying a low potential are required.

FIGS. 13A and 13B are diagrams illustrating the relation between an inverter circuit of a CMOS, its signal output, and a change in power source and ground potential. When the output of the CMOS inverter configured as shown in FIG. 13A switches from a low level to a high level, the NMOS 805 side is closed and the PMOS 804 side is opened. Consequently, charging current 807 is produced such that charges accumulated in a power source 802 pass through the PMOS 804 and accumulate in a load 806. At the instant when this switching from the low to high level takes place, the charges are released from a power source conductor and a spike noise consequently occurs such that the power source potential momentarily decreases.

In addition, when the output of the CMOS inverter switches from a high level to a low level, discharge current 808 is produced such that the PMOS 804 side is closed, the NMOS 805 side is opened, and charges accumulated in the load 806 flow into the ground 803 through the NMOS 805. At the instant when this switching from high to low level takes place, charges flow from the load 806 into the ground 803, with the result that the ground potential momentarily increases and hence so-called the spike noise is generated.

Accordingly, at the time of a clock output 809, a spike noise occurs in a power source potential waveform 810 and also in a ground potential waveform 811 such that the directions of the noises are alternately opposite to each other. The circuit is operated by the difference between the power source potential and the ground potential. Accordingly, the potential difference that the circuit receives is affected by a spike noise 812 with a periodicity of half the clock. Such changes in potential cause, for example, erroneous operations of an LSI or changes in output timing of a signal.

As disclosed in Japanese Patent Application Laid-Open No. 2006-261470, recent LSIs have generally been designed such that a capacitive component, such as a bypass capacitor, is disposed between the power source and the ground. As shown in FIG. 14A, a capacitor 814 disposed to prevent the above-mentioned problems causes decrease in the ground potential, which follows the decrease in the power source 802 potential which is caused upon the switching. This makes changes in the power source potential waveform 815 and those in the ground potential waveform 816 coincide as shown in FIG. 14B. Accordingly, the potential difference 817 between the power source and the ground is greatly reduced.

However, a bypass capacitor disposed on a printed wiring board only reduces the noise arising from the differential between the power source and ground. It is actually difficult to ensure an ideal ground and hence impossible to suppress a common mode noise in which the potentials of the power source and ground change in the same phase even when the bypass capacitor is used.

Like the differential mode noise, the common mode noise is emitted into the space, with a power source conductor and ground conductor as antennas, and increase radiation noise becomes increase radiation noise.

As a means for reducing the common mode noise, a technology has been proposed in which a ferrite core is attached to a printed wiring board and the common mode noise is converted into heat. However, in order to obtain this effect in a required frequency band, the ferrite core needs to have a certain degree of capacitance. In addition, since the ferrite core is of a sintered body, it is difficult to produce small ferrite cores. In addition, the ferrite core needs to be disposed in a plurality of areas where noise is to be restrained. Accordingly, this is not an effective means in terms of cost either.

A technique for reducing a common mode noise generated in two conductors is proposed in US 2006/0125570. According to this document, center tap termination is constituted such that two signal conductors in differential signal transmission are connected by two capacitors connected in series between the signal conductors and the ground and a junction point of the two capacitors is connected by a resistor.

However, this technique is designed to reduce a common mode noise relative to differential signals, and cannot cope with a common mode noise arising from the power source and ground of a DC circuit. Specifically, in the case of a DC circuit as shown in FIG. 13A, a common mode noise flows in the same direction in power source wiring and ground wiring. Accordingly, the center tap termination as shown in FIG. 14A is not applicable. To be specific, since the common mode noise arises between the power source and the ground, a ground connected through a resistor is not included in the circuit.

It is known that such common mode noise arising between the power source and ground may cause considerable radiation noise even with slight current. Therefore, on account of higher speed LSIs, it has recently become important to reduce radiation noise caused by the common mode noise arising from between the power source and ground.

DISCLOSURE OF THE INVENTION

It is accordingly an object of the present invention to provide a printed circuit board designed such that radiation noise caused by a common mode noise arising from between the ground and the power source of a semiconductor integrated circuit mounted on a printed wiring board is reduced by an inexpensive configuration.

The printed circuit board is configured such that a semiconductor integrated circuit having a power source terminal and a ground terminal is mounted on a printed wiring board having a power source pattern and a ground pattern respectively connected to the power source terminal and the ground terminal of the semiconductor integrated circuit. The printed wiring board includes: a power source plane connected to the power source pattern, a ground plane connected to the ground pattern, a plane conductor connected to neither the power source pattern nor the ground pattern, and a conductor pattern connected to the power source pattern and the ground pattern respectively through a capacitor. The plane conductor and the conductor pattern are connected through a filter. The plane conductor has an area superposed on at least one of the power source terminal and the ground terminal of the semiconductor integrated circuit.

Further features of the present invention will become apparent from the following description of exemplary embodiments with reference to the attached drawings.

Further features of the present invention will become apparent from the following description of exemplary embodiments with reference to the attached drawings.

BEST MODE FOR CARRYING OUT THE INVENTION

Referring to the accompanying drawings, the best modes for carrying out the present invention will hereinafter be described.

First Embodiment

Figure 1:
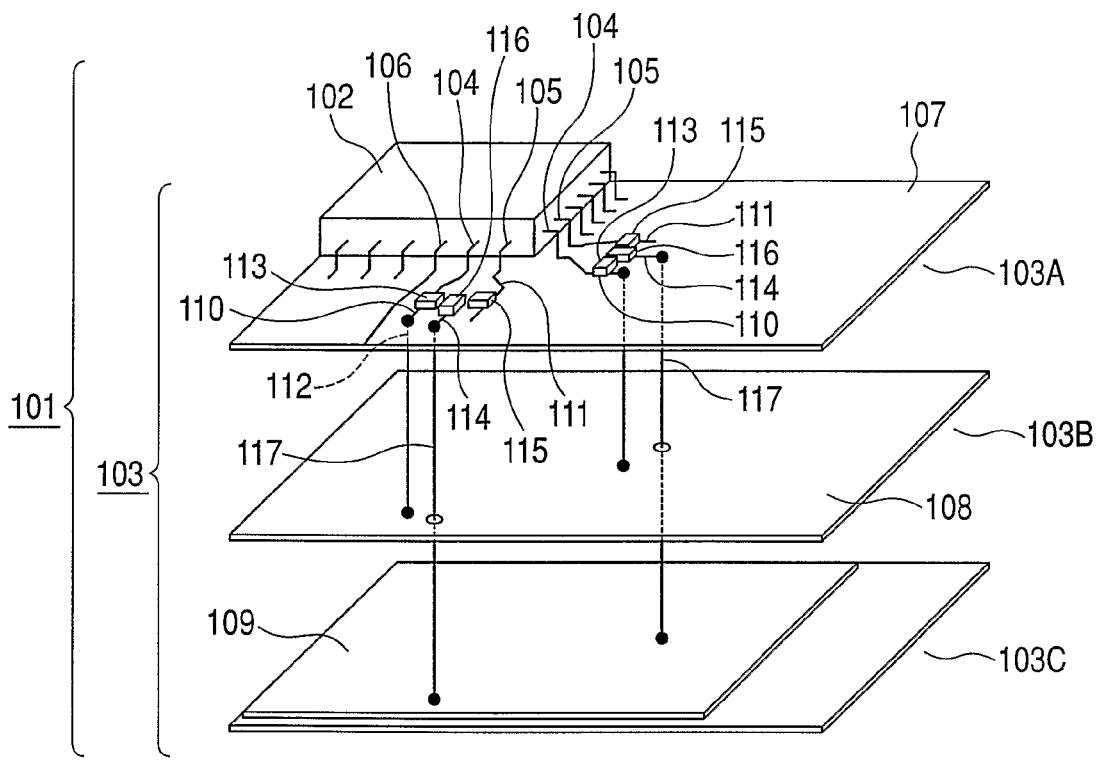
FIG. 1 is a schematic view of a printed circuit board according to a first embodiment.
Figure 2:
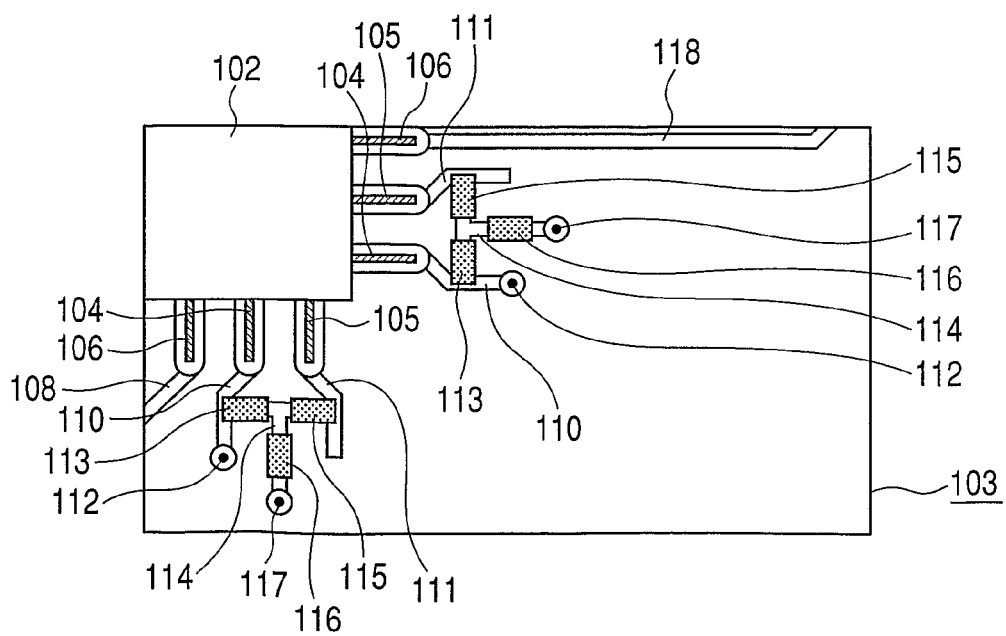
FIG. 2 is a plan view of the main part of the printed circuit board according to the first embodiment.

FIG. 1 is a schematic view of a printed circuit board according to a first embodiment. FIG. 2 is a plan view of the main part of the printed circuit board shown in FIG. 1, and shows in detail the part on which a power source terminal 104 and a ground terminal 105 of a semiconductor integrated circuit 102 are mounted.

The printed circuit board 101 includes the packaged semiconductor integrated circuit 102 and a multilayer printed wiring board 103. The semiconductor integrated circuit 102 in a QFP (Quad Flat Package) has the above-mentioned power source terminal 104, the ground terminal 105, and a plurality of signal terminals 106. The printed wiring board 103 is a multilayer (two-layer) board made of FR4. A first layer 103A has a ground plane 107. A second layer 103B has a power source plane 108 that supplies a reference potential. A third layer 103C has a plane conductor 109 that is not connected to the power source plane 108 and ground plane 107 directly. The printed wiring board 103 according to the first embodiment is formed from the first layer 103A, second layer 103B, and third layer 103C. However, the present invention is not limited thereto and the multilayer printed wiring board may have four or more layers.

The power source terminal 104 and the ground terminal 105 are respectively connected to a power source pattern 110 and a ground pattern 111 formed on the first layer 103A. The power source pattern 110 is connected to the power source plane 108 through a via 112. The ground pattern 111 is connected to the ground plane 107. The power source pattern 110 is connected to a conductor pattern 114 through a capacitor 113. The ground pattern 111 is also connected to the conductor pattern 114 through a capacitor 115. The conductor pattern 114 is connected to a via 117 through a filter 116 such as a resistor or bead inductor. The via 117 is connected to the plane conductor 109. Also formed on the first layer 103A is a signal pattern 118 connected to the signal terminal 106.

In the printed circuit board 101 shown in FIG. 1, a common mode noise between the power source and the ground flows into the plane conductor 109 after passing through the capacitors 113 and 115, the conductor pattern 114, the filter 116, and the via 117 in this order. In this case, it is assumed that the plane conductor 109 formed on the third layer 103C of the printed wiring board 103 serves as a reference in relation to the common mode noise. As a result, the impedance relative to the common mode noise decreases, and the noise flows into the plane conductor 109.

In order to use the plane conductor 109 as a reference plane, it is preferable that the plane conduct 109 overlaps with at least one of the power source terminal 104 and the ground terminal 105, when perspectively viewing the printed circuit board 101 from a vertical direction. It is more preferable that the plane conductor 109 be located directly below the semiconductor integrated circuit 102 and larger than the outer shape of the semiconductor integrated circuit 103. If ensuring low impedance, the plane conductor 109 may have meshes or holes for vias.

The common mode noise flows into the plane conductor 109 as described above to prevent the common mode noise from flowing into other circuit boards or cables, thus reducing occurrences of radiation noise. In addition, capacitors 113 and 115 connected in series are effective for differential mode noises. In addition, disposing the capacitors 113 and 115 parallel to each other also reduces the self-inductance of each capacitor and further decreases high frequency noises.

The common mode noise that has flowed into the plane conductor 109 causes superimposition in the plane conductor 109. This may not lead to a major problem because the plane conductor 109 is not connected to any other circuit. However, the physical shape of the plane conductor 109 may give rise to resonance. If resonance arises, the pole of the impedance may be generated at a specific frequency to worsen radiation noise depending on the operating frequency of the circuit. In this respect, a method for releasing the superimposing noise in the plane conductor 109 is proposed as shown in FIG. 3.

Figure 3:
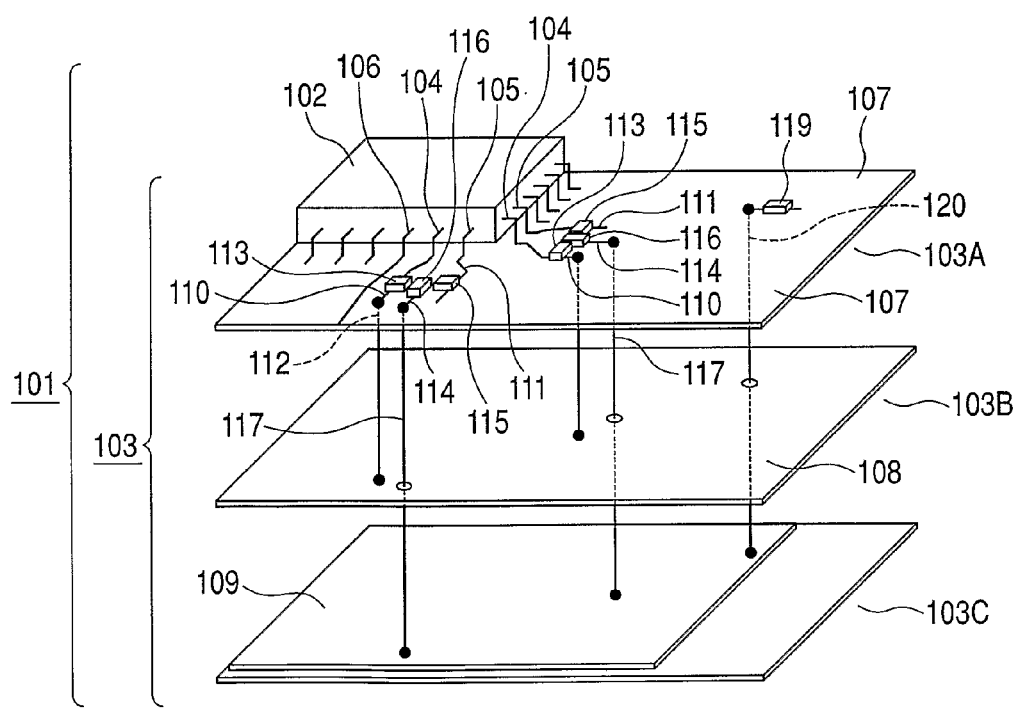
FIG. 3 is a schematic view of another form of the printed circuit board according to the first embodiment.

FIG. 3 shows a printed circuit board shown in FIG. 1, to which a second filter 119 has been added. The second filter 119 is mounted on the first layer 103A such that its one end is connected to the plane conductor 109 through a via 120 and its other end is connected to the ground plane on the first layer 103A. Energy produced by resonance caused by common mode noise that have flowed in the plane conductor 109 can be converted into heat by the second filter 119, thus preventing the common noise from being superposed in the plane conductor 109. Accordingly, radiation noise can be restrained.

A resistor or bead inductor is suitable for use as the second filter 119. If the frequency of noise to be restrained is specified, a capacitor in accordance with the frequency may be disposed. The other end of the second filter 119 is connected to the ground plane on the first layer 103A. However, the invention is not limited to this, but the other end may be connected to any part of the printed circuit board 101 as long as this part serves as a ground independent of the plane conductor. Instead of the ground, the other end of the second filter 112 may be connected to a power source plane.

In the case of conventional printed circuit boards that use neither the capacitors 113 and 115 nor filters 116, a common mode noise flows into the ground plane 107 and power source plane 108 via the power source pattern 110 and the ground pattern 111. Generally, it is believed that the return current of the common mode noise (i.e., current) passes through the earth. Therefore, in a common mode circuit using the earth as its reference, the impedance of a signal conductor composed of the power source plane 108 and ground plane 107 is very high. Consequently, radiation noise may occur, with the ground plane 107 and power source plane 108 serving as antennas. In addition, radiation noise may occur with a cable connected to the printed circuit board acting as an antenna.

Second Embodiment

Figure 4:
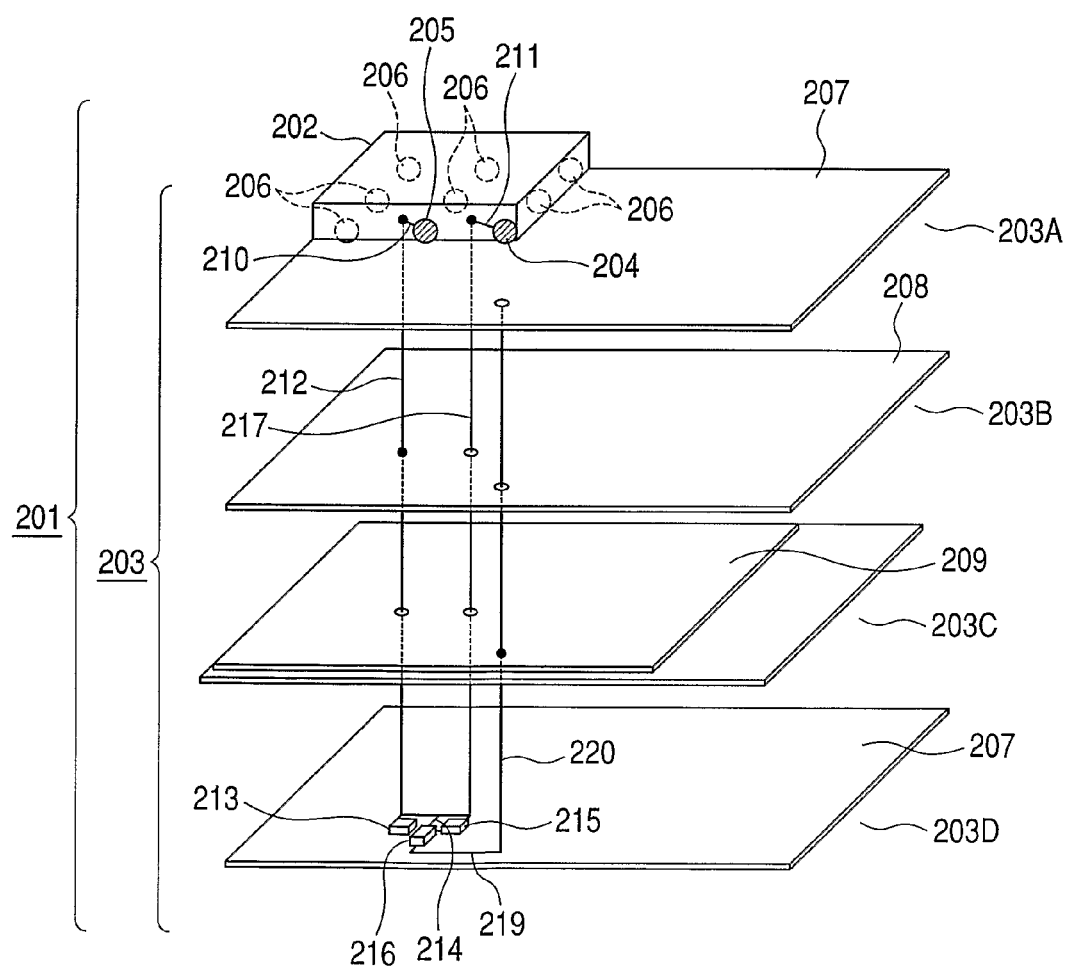
FIG. 4 is a schematic view of a printed circuit board according to a second embodiment.

FIG. 4 is a schematic view of the main part of a printed circuit board according to the second embodiment.

A printed circuit board 201 includes a semiconductor circuit 202 and a multilayer printed wiring board 203. The semiconductor integrated circuit 202 contained in a BGA (Ball Grid Allay) has a power source solder ball 204, a ground solder ball 205, and a plurality of signal solder balls 206. The printed wiring board 203 is a four-layer board made of FR4. The first layer 203A has a ground plane 207. The second layer 203B has a power source plane 208 that supplies reference potential. The third layer 203C has a plane conductor 209 that is not connected to the power source plane 208 and ground plane 207 directly. The fourth layer 203D forms the back of the printed wiring board 203, and various electronic components are mounted on this back.

Perspectively viewing the printed circuit board 201 from a vertical direction, it is preferable that the area of the plane conductor 209 be located such that the plane conductor 209 overlaps with at least one of the power source terminal 204 and the ground terminal 205. It is more preferable that the plane conductor 209 be located directly below the semiconductor integrated circuit 202 and larger than the outer shape of the semiconductor integrated circuit 203. If ensuring low impedance, the plane conductor 209 may have meshes or holes for vias.

The power source solder ball 204 is connected to a power source pattern 210 on the printed circuit board 203, and the ground solder ball 205 is connected to a ground pattern 211 on the printed circuit board 203. The power source pattern 210 is connected to the second layer 203B through a via 212 and further connected to the fourth layer 203D. The ground pattern 211 is connected to the ground plane 207 of the first layer 203A and further connected to the fourth layer 203D through a via 217 disposed near the ground pattern 211. On the fourth layer 203D, the vias 212 and 217 are connected to a first conductor pattern 214 through capacitors 213 and 215 respectively. The first conductor pattern 214 and the second conductor pattern 219 are connected through a chip resistor 216. The second conductor pattern 219 is connected to the plane conductor 209 of the third layer 203C through a via 220.

A common mode noise arising from the power source solder ball 204 and the ground solder ball 205 flows into the vias 212 and 217, and then the capacitors 213 and 215 and first conductor pattern 214 of the fourth layer 203D. The noise further flows from the first conductor pattern 214 to the second conductor pattern 219 through the chip resistor 216. The noise flows yet further into the plane conductor 209 of the third layer 203C through the via 220. In this case, like the filters 116 used in the first embodiment, the chip resistor 216 serves as a path for conducting the common mode noise into the plane conductor. The common mode impedance of the ground plane 207 relative to the earth is generally 150 Ω or so. For a path to plane conductor 209, if its impedance is not less than 150 Ω, the common mode noise does not flow into the plane conductor 209. For this reason, it is preferable that the chip resistor 216 be 150 Ω or below. This makes it possible to reduce radiation noise by a configuration less expensive than that involving a filter.

The common mode noise that has flowed in the plane conductor 209 causes superimposition in the plane conductor 209. Since the plane conductor 209 is not connected to any other circuit, major problems do not arise. However, the common mode noise may cause resonance due to the physical shape of the plane conductor 209. If resonance arises, a pole of the impedance may arise at a specific frequency, hence making radiation noise worse depending on the operating frequency of the circuit. In this respect, a method for releasing the superimposing noise in the plane conductor 209 is shown in FIG. 5.

Figure 5:
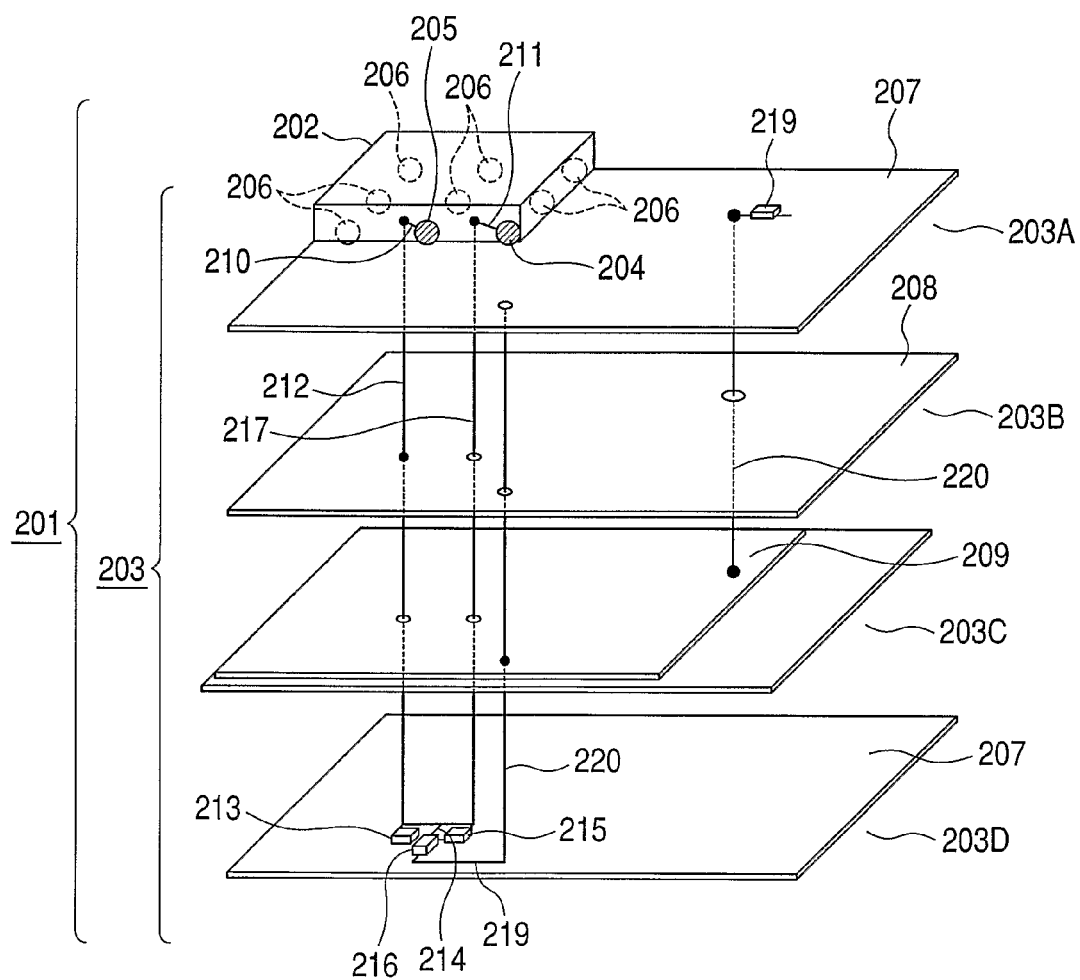
FIG. 5 is a schematic view of another form of the printed circuit board according to the second embodiment.

FIG. 5 shows a printed circuit board as shown in FIG. 4, to which a second filter 219 has been added. The second filter 219 is mounted on the first layer 203A such that its one end is connected to the plane conductor 209 through a via 220 and its other end is connected to the ground plane of the first layer 203A. Energy produced by resonance caused by the common mode noise that have flowed in the plane conductor 209 may be converted into heat by the second filter 219, thus preventing the common mode noise from being piled up in the plane conductor 209. Accordingly, radiation noise can be restrained.

A Resistor or bead inductor is suitable for use as the second filter 219. If the frequency of noise to be restrained is specified, a capacitor in accordance with the frequency may be disposed. The other end of the second filter 219 is connected to the ground plane of the first layer 203A. However, the invention is not limited to this, but the other end of the second filter 219 may be connected to any part of the printed circuit board 101 as long as this part serves as a ground independent of the plane conductor. Instead of the ground, the other end of the second filter 219 may be connected to the power source plane.

Third Embodiment

Figure 6:
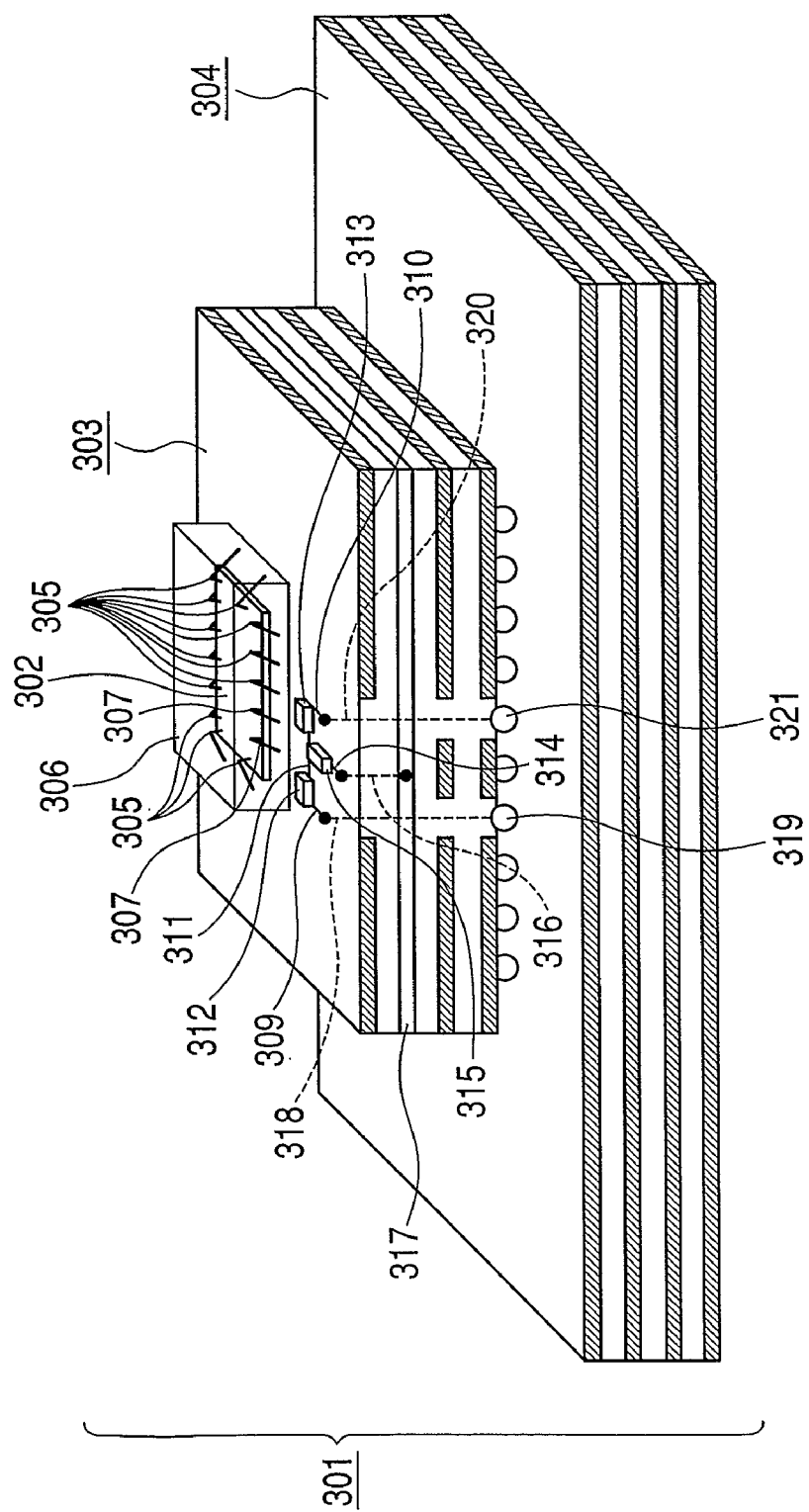
FIG. 6 is a perspective view of a printed circuit board according to a third embodiment.
Figure 7:
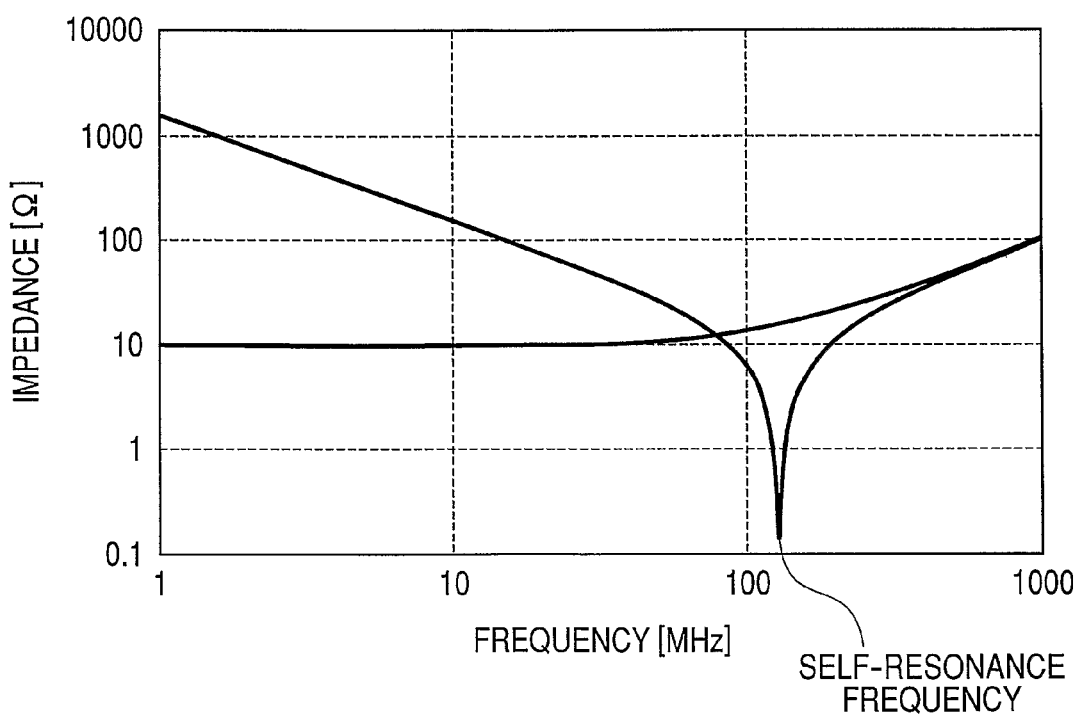
FIG. 7 is a graph representing the radiation noise reduction effect of the printed circuit board according to the third embodiment.

FIG. 6 is a perspective view of a printed circuit board according to a third embodiment. FIG. 7 is a graph representing the radiation noise reduction effect in the third embodiment.

The printed circuit board 301 includes a semiconductor integrated circuit 302, a first printed wiring board 303 and a second printed wiring board 304. The semiconductor integrated circuit 302 and the first printed wiring board 303 are electrically and physically connected by a bonding wire 305 and covered by a resin mold 306. The first printed wiring board 303 and the second printed wiring board 304 are connected by a power source solder ball 319 and a ground solder ball 321.

The power source of the semiconductor circuit 302 and the power source pattern 309 of the first printed wiring board 303 are connected by a power source bonding wire 307. The ground of the semiconductor integrated circuit 302 and the ground pattern 310 of the first printed wiring board 303 are connected by a ground bonding wire 308. The power source pattern 309 and a first conductor pattern 311 are connected by a capacitor 312. The ground pattern 310 and a first conductor pattern 311 are connected by a capacitor 313. The first conductor pattern 311 and a second conductor pattern 314 are connected together by a capacitor (i.e., chip capacitor) 315. The second conductor pattern 314 is connected to the plane conductor 317 of the first printed wiring board 303 by a via 316.

The plane conductor 317 does not establish direct current continuity with the power source pattern 309 and ground pattern 310 of the first printed wiring board 303. The power source pattern 309 establishes continuity with the power source solder ball 319 through a via 318 and is thereby connected to the power source conductor of the second printed wiring board 304. The ground pattern 310 establishes continuity with the ground solder ball 321 through a via 320 and is thereby connected to the ground conductor of the second printed wiring board 304.

A common mode noise generated by the power source and ground of the semiconductor integrated circuit 302 flows into the power source pattern 309 and ground pattern 310 of the first printed wiring board 303 through the bonding wires 307 and 308. The common mode noise further flows into the plane conductor 317 through capacitors 312 and 313, first conductor pattern 311, capacitor 315, second pattern conductor 314, and via 316. This affords a comparative reduction of the common mode noise flowing in the second printed wiring board 304, and hence suppresses generation of radiation noise caused by the second printed wiring board 304 serving as an antenna.

In this case, the capacitors 312 and 313 function to suppress the differential mode noise being generated between the power source and ground as well, so that the capacities of the capacitors 312 and 313 are preferably as great as 0.1 µF or more. This third embodiment uses the capacitor 315 in lieu of the filters 116 and 216 used in the first and second embodiments respectively. Capacitors generally have self-resonance frequencies as shown in FIG. 5. Selecting the capacitor 405 so that the peak frequency of radiation to be restrained is substantially equal to the self-resonance frequency makes it possible to selectively reduce the noise at a specific frequency.

When a capacitor is used as a filter as above, the common mode noise to be absorbed into the plane conductor can be selected by using the self-resonance frequency of the capacitor.

Fourth Embodiment

Figure 8:
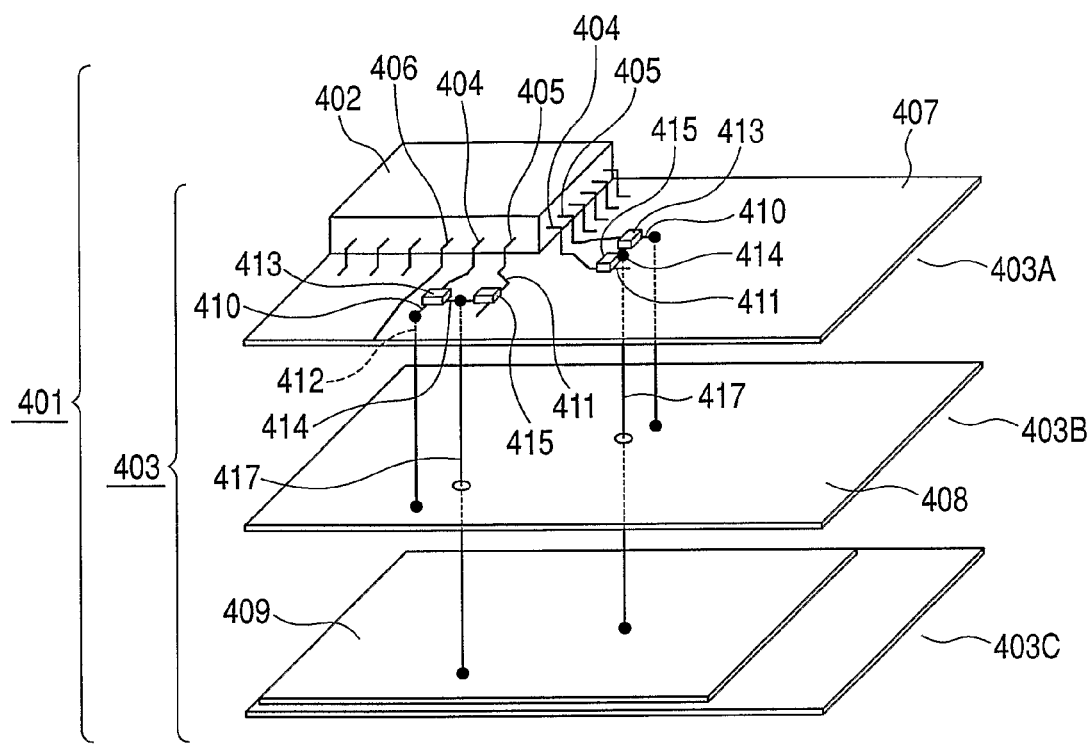
FIG. 8 is a schematic view of a printed circuit board according to a fourth embodiment.
Figure 9:
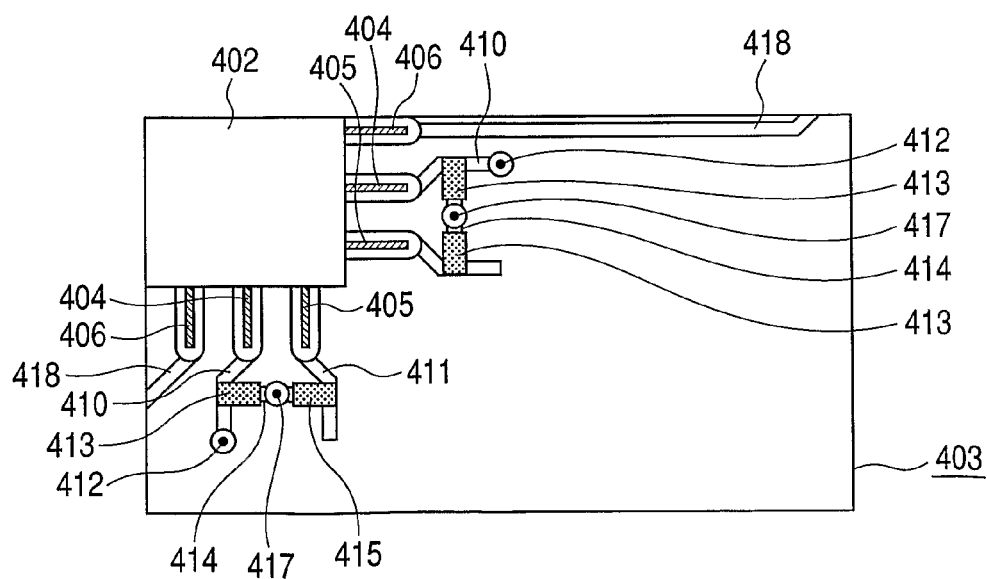
FIG. 9 is a plan view of the main part of the printed circuit board according to the fourth embodiment.

FIG. 8 is a schematic view of a printed circuit board according to the fourth embodiment. FIG. 9 is a plan view of the main part of the printed circuit board shown in FIG. 8, and shows in detail the part on which the power source terminal 404 and ground terminal 405 of the semiconductor integrated circuit 402 shown in FIG. 8 are mounted.

The printed circuit board 401 includes a semiconductor integrated circuit 402 and a multilayer printed wiring board 403. The semiconductor integrated circuit 402 in a QFP (Quad Flat Package) has a power source terminal 404, a ground terminal 405 and a plurality of signal terminals 406. The printed wiring board 403 is a multi-layer board made of FR4. The first layer 403A has a signal pattern 418 and a ground plane 407. The second layer 403B has a power source plane 408 that supplies reference potential. The third layer 403C has a ground conductor, and a plane conductor 409 not connected to the power source plane 408 and ground plane 407 directly.

The power source terminal 404 is connected to a power source pattern 410 on the printed wiring board 403, and the ground terminal 405 is connected to a ground pattern 411 on the printed wiring board 403. The power source pattern 410 is connected to the power source plane 408 through a via 412. The ground pattern 411 is connected to the ground plane 407. The power source pattern 410 is connected to a conductor pattern 414 through a capacitor 413. The ground pattern 411 is connected to the conductor pattern 414 through a capacitor 415. The conductor pattern 414 is connected to the plane conductor 409 through a via 417.

In the fourth embodiment, the plane conductor 409 is connected to the power source pattern 410 through the capacitor 413, and also to the ground pattern 411 through the capacitor 415. That is, the via 417, the capacitor 413, and the capacitor 415 are directly connected without the filter 116 shown in FIG. 1, the chip resistor 216 in FIG. 4, or the capacitor 315 in FIG. 6.

The common mode noise that has flowed in the plane conductor 409 is piled up thereon. However, the plane conductor 409 is disposed independently of other circuits and, accordingly, generation of radiation noise is prevented. With such a simple form, the fourth embodiment affords a comparative reduction of the common mode noise flowing in the power source plane 408 and ground plane 407 of the printed wiring board 403, which can serve as antennas, and thus restrains generation of radiation noise.

The common mode noise piled up in the plane conductor 409 does not lead to major problems because the plane conductor 409 is not connected to any other circuit. However, the physical shape of the plane conductor 409 may give rise to resonance. If resonance arises, the impedance causes a pole at a specific frequency and consequently worsens radiation noise depending on the operating frequency of the circuit. To solve this problem, a method for releasing the superimposing noise in the plane conductor 409 is shown in FIG. 10.

Figure 10:
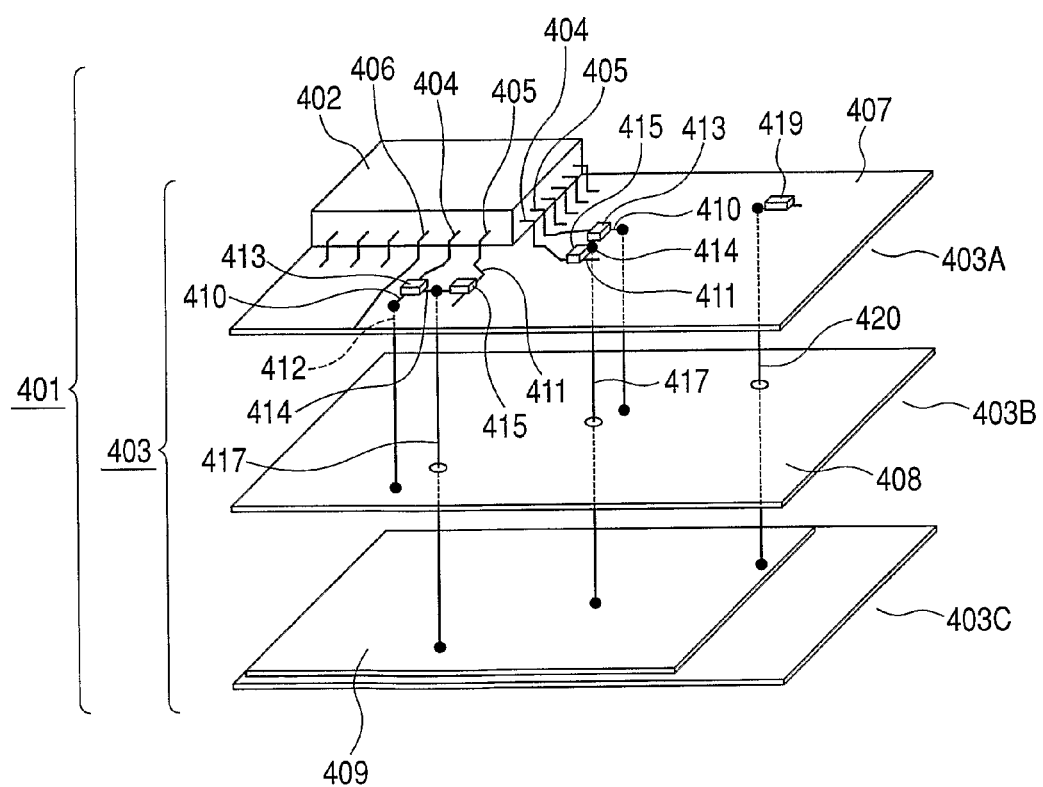
FIG. 10 is a schematic view of another form of the printed circuit board according to the fourth embodiment.

FIG. 10 shows a printed circuit board as shown in FIG. 8, to which a second filter 319 has been added. The second filter 419 is mounted on the first layer 403A such that its one end is connected to the plane conductor 409 through a via 420 and its other end is connected to the ground plane of the first layer 403A. Energy produced by resonance caused by the common mode noise that has flowed in the plane conductor 409 can be converted into heat by the second filter 419, thus preventing the common noise from being superposed in the plane conductor 409. Accordingly, radiation noise can be restrained.

A resistor or bead inductor is suitable for use as the second filter 119. If the frequency of the noise to be restrained is specified, a capacitor corresponding to the frequency may be disposed. The other end of the second filter 419 is connected to the ground plane of the first layer 403A. However, the invention is not limited to this, but the other end may be connected to any part of the printed circuit board 101 as long as this part serves as a ground independent of the plane conductor. Instead of the ground, the other end of the second filter 419 may be connected to a power source plane.

Perspectively viewing the printed circuit board 401 from a vertical direction, it is preferable that the area of the plane conductor 409 be located such that the plane conductor 409 overlaps with at least one of the power source terminal 404 and the ground terminal 405. It is more preferable that the plane conductor 409 be located directly below the semiconductor integrated circuit 402 and larger than the outer shape of the semiconductor integrated circuit 403. If ensuring the low impedance, the plane conductor 409 may have meshes or holes for vias.

Fifth Embodiment

Figure 11:
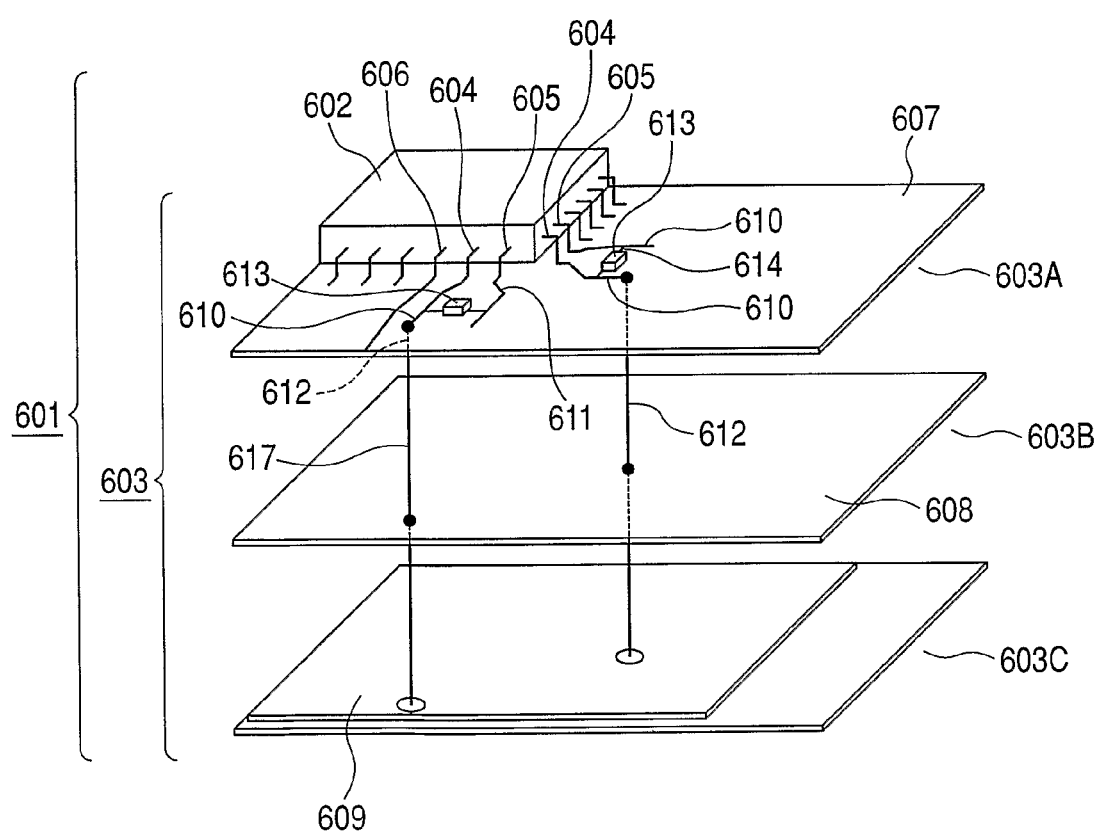
FIG. 11 is a schematic view of a printed circuit board according to a fifth embodiment.

FIG. 11 is a perspective view of the main part of a printed circuit board according to a fifth embodiment.

The printed circuit board 601 includes a packaged semiconductor integrated circuit 602 and a multilayer printed wiring board 603. The semiconductor integrated circuit 602 contained in a QFP (Quad Flat Package) has a power source terminal 604 and a ground terminal 605. The printed wiring board 603 is a multilayer board made of FR4. A first layer 603A has a ground plane 607. A second layer 603B has a power source plane 608 that supplies a reference potential. A third layer 603C has a plane conductor 609 that is not connected to the power source plane 608 and ground plane 607 directly.

The power source terminal 604 is connected to a power source pattern 610 on the printed circuit board 603. The ground terminal 605 is connected to a ground pattern 611 on the printed circuit board 603. The power source pattern 610 is connected to the power source plane 608 through a via 612. Disposed near the power source pattern 610 is a capacitor 613 connecting a power source and a ground.

Perspectively viewing the printed circuit board 601 from a vertical direction, it is preferable that the area of the plane conductor 609 be located such that the plane conductor 609 overlaps with at least one of the power source terminal 604 and the ground terminal 605. It is more preferable that the plane conductor 609 be located directly below the semiconductor integrated circuit 602 and larger than the outer shape of the semiconductor integrated circuit 603. If ensuring the low impedance, the plane conductor 609 may have meshes or holes for vias.

The loop of a common mode noise is very large because the earth surface acts as a return path for the noise. In other words, canceling effect of the return current of the common mode noise flowing in the earth surface is low to be a significant factor to cause radiation noise. However, disposing the plane conductor 609 provides a return path for a common mode noise with the loop being remarkably small compared to that of the common mode noise flowing in the earth surface. This is believed to yield an effective reduction in radiation noise. Accordingly, without capacitors or filters, radiation noise resulting from a common mode noise generated by a power source and ground conductor can be restrained.

Since the plane conductor 609 acts as a return path for the common mode noise flowing in the power source pattern 610 and ground pattern 611, the loop path for the common mode noise can be shortened compared to that through the earth surface. Accordingly, radiation noise can be reduced.

Disposing the plane conductor 609 so as to overlap with the outer shape of the semiconductor integrated circuit 602 makes it possible to increase the capacity coupling required for the common mode noise flowing in the plane conductor 609 to return to the semiconductor integrated circuit 602, which is the source of the common mode noise. As a result, the common mode noise impedance of the plane conductor 609 decreases, and the common mode noise flowing in the plane conductor 609 increases. This reduces the common mode noise flowing in the power source plane and ground plane relatively, thus suppressing the occurrence of radiation noise.

The common mode noise piled up in the plane conductor 409 does not lead to major problems because the plane conductor 109 is not connected to any other circuit. However, the physical shape of the plane conductor 409 may give rise to resonance. If resonance arises, a pole of the impedance may arise at a specific frequency and consequently worsen radiation noise depending on the operating frequency of the circuit. To solve this problem, a method for releasing the superimposing noise in the plane conductor 409 is shown in FIG. 10.

Figure 12:
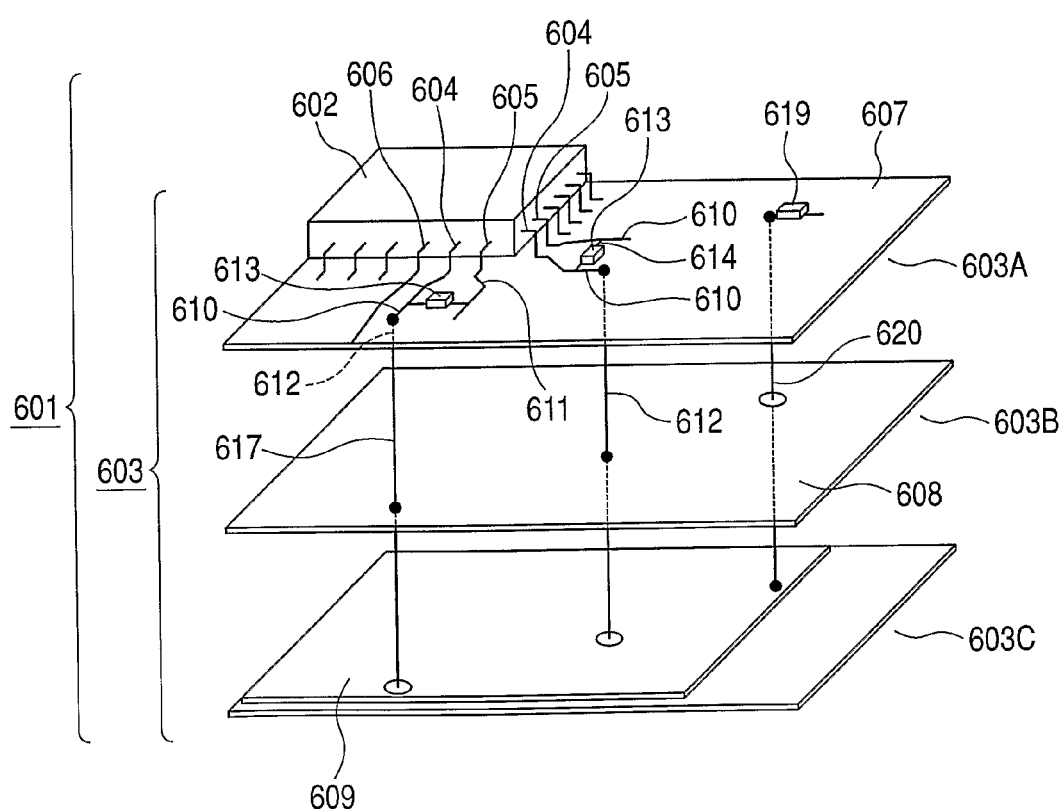
FIG. 12 is a schematic view of another form of the printed circuit board according to the fifth embodiment.
Figure 13A:
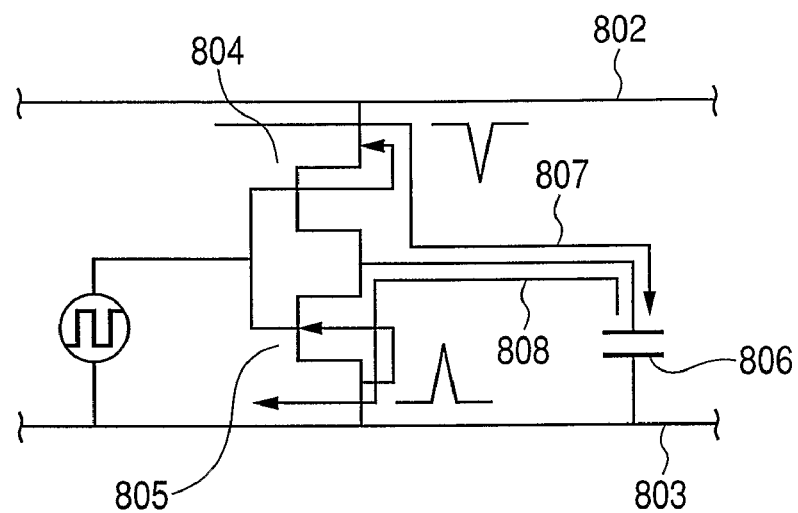
FIG. 13A is a diagram showing the configuration of a conventional inverter circuit.
Figure 13B:
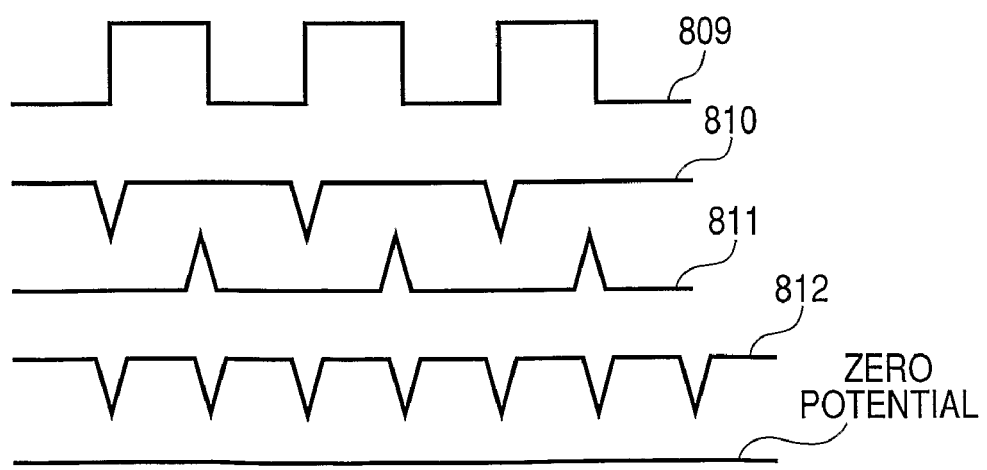
FIG. 13B is a graph relating to a conventional inverter circuit.
Figure 14A:
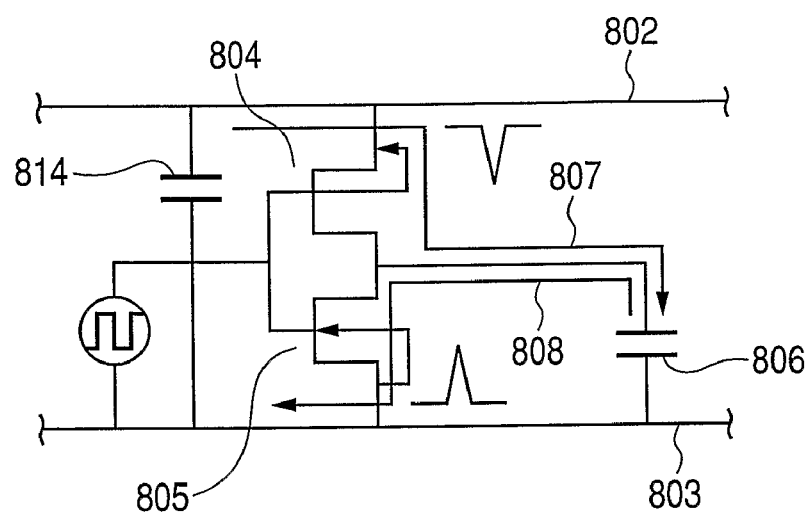
FIG. 14A is a diagram showing the configuration of a conventional inverter circuit.
Figure 14B:
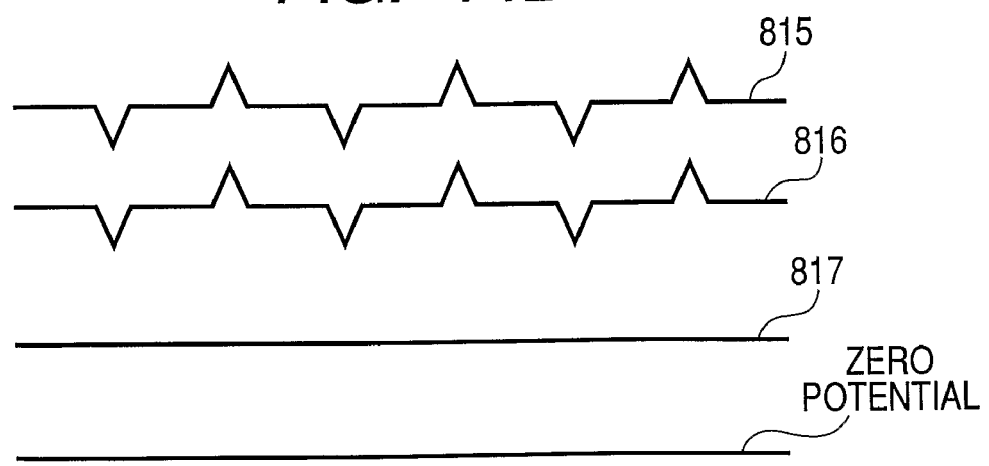
FIG. 14B is a graph relating to a conventional inverter circuit.

FIG. 12 shows a printed circuit board as shown in FIG. 11, to which a second filter 419 has been added. The second filter 419 is mounted on the first layer 403A such that its one end is connected to the plane conductor 409 through a via 420 and its other end is connected to the ground plane of the first layer 403A. Energy produced by resonance caused by the common mode noise that has flowed in the plane conductor 409 can be converted into heat by the second filter 419, thus preventing the common mode noise from being piled up in the plane conductor 409. Accordingly, radiation noise can be restrained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-160907, filed Jun. 19, 2007, and 2008-118808, filed Apr. 30, 2008 which are hereby incorporated by reference herein in their entirety.

The invention claimed is:

1. A printed circuit board comprising:
a semiconductor integrated circuit having a power source terminal and a ground terminal; and
a printed wiring board on a surface of which the semiconductor integrated circuit is mounted, the printed wiring board having on the surface a power source pattern connected to the power source terminal and a ground pattern connected to the ground terminal and a conductor pattern,
wherein the printed wiring board includes a plane conductor that does not establish direct current continuity with the power source pattern and the ground pattern,
wherein the power source pattern is connected to the conductor pattern through a first capacitor, the ground pattern is connected to the conductor pattern through a second capacitor, and the conductor pattern is connected to the plane conductor through a first filter, and
wherein the printed wiring board is a multilayer board and includes a ground layer, a power source layer, and a wiring layer in which the plane conductor is formed, and wherein the plane conductor is connected to one of the ground layer and the power source layer through a second filter.

* * * * *